(12) United States Patent
Kinose

(10) Patent No.: US 11,214,863 B2
(45) Date of Patent: Jan. 4, 2022

(54) METHOD OF CONTROLLING CONTAMINATION OF VAPOR DEPOSITION APPARATUS AND METHOD OF PRODUCING EPITAXIAL WAFER

(71) Applicant: SUMCO CORPORATION, Tokyo (JP)

(72) Inventor: Shota Kinose, Tokyo (JP)

(73) Assignee: SUMCO CORPORATION, Tokyo (JP)

(*) Notice: Subject to any disclaimer, the term of this patent is extended or adjusted under 35 U.S.C. 154(b) by 87 days.

(21) Appl. No.: 16/771,395

(22) PCT Filed: Dec. 4, 2018

(86) PCT No.: PCT/JP2018/044602
§ 371 (c)(1),
(2) Date: Jun. 10, 2020

(87) PCT Pub. No.: WO2019/124061
PCT Pub. Date: Jun. 27, 2019

(65) Prior Publication Data
US 2020/0392618 A1  Dec. 17, 2020

(30) Foreign Application Priority Data
Dec. 22, 2017  (JP) .............................. JP2017-246867

(51) Int. Cl.
*H01L 21/66* (2006.01)
*C23C 16/44* (2006.01)
(Continued)

(52) U.S. Cl.
CPC .... *C23C 16/4401* (2013.01); *H01J 37/32862* (2013.01); *H01L 21/67098* (2013.01); *H01L 21/67242* (2013.01); *H01L 22/30* (2013.01)

(58) Field of Classification Search
CPC ...................................................... H01L 22/12
See application file for complete search history.

(56) References Cited

U.S. PATENT DOCUMENTS

2008/0093023 A1* 4/2008 Tomita ................ C23C 16/4405
156/345.26
2009/0209090 A1* 8/2009 Yokoyama .......... H01L 29/6606
438/476
(Continued)

FOREIGN PATENT DOCUMENTS

JP  2000-150526 A  5/2000
JP  2014-82324 A   5/2014
(Continued)

OTHER PUBLICATIONS

ISR for PCT/JP2018/044602, dated Mar. 12, 2019 (w/ translation).
IPRP for PCT/JP2018/044602, dated Jul. 2, 2020 (w/ translation).

*Primary Examiner* — Jae Lee
(74) *Attorney, Agent, or Firm* — Greenblum & Bernstein, P.L.C.

(57) ABSTRACT

A method of controlling contamination of a vapor deposition apparatus includes: a wafer loading step of loading a wafer for contamination evaluation into a chamber of the vapor deposition apparatus; a heat treatment step of heat treating the wafer for contamination evaluation at a heat treatment temperature of 1190° C. or more at a hydrogen flow rate of 30 slm or less; a wafer unloading step of unloading the wafer for contamination evaluation from the inside of the chamber; and a wafer contamination evaluation step of evaluating a level of metal contamination of the wafer for contamination evaluation. In a method of producing an epitaxial wafer, epitaxial growth is performed using a vapor deposition apparatus whose contamination is controlled by the contamination controlling method.

8 Claims, 8 Drawing Sheets

(51) Int. Cl.
*H01J 37/32* (2006.01)
*H01L 21/67* (2006.01)

(56) References Cited

U.S. PATENT DOCUMENTS

| | | |
|---|---|---|
| 2015/0243566 A1 | 8/2015 | Arai et al. |
| 2016/0097144 A1 | 4/2016 | Nogami |
| 2021/0066069 A1* | 3/2021 | Lee .................. H01L 21/02491 |

FOREIGN PATENT DOCUMENTS

| | | |
|---|---|---|
| JP | 2014-103328 A | 6/2014 |
| JP | 2014-229821 A | 12/2014 |
| JP | 2015-29002 A | 2/2015 |
| JP | 2015-211064 A | 11/2015 |
| JP | 2016-76518 A | 5/2016 |
| JP | 2016-100577 A | 5/2016 |

* cited by examiner

METHOD OF CONTROLLING CONTAMINATION OF VAPOR DEPOSITION APPARATUS AND METHOD OF PRODUCING EPITAXIAL WAFER

TECHNICAL FIELD

This disclosure relates to a method of controlling contamination of a vapor deposition apparatus and a method of producing an epitaxial wafer.

BACKGROUND

In recent years, as the resolution of camera functions included in digital cameras, smartphones, mobile PCs, etc. becomes higher, there is a demand for enhancing contamination control of epitaxial silicon wafers used for imaging devices such as CCDs and CISs.

In particular, there is a demand for investigating the cause of white spot problems which are peculiar to imaging devices and enhancing the process management. At present, metal contamination is considered as a cause of the formation of white spots. In particular, slowly diffusing metals such as Mo, W, Ti, Nb, and Ta are considered to be a major factor.

Examples of contamination sources of metal contamination of an epitaxial silicon wafer include a source gas used in epitaxial growth and a cleaning gas for cleaning the interior of a chamber. Other examples include materials forming the chamber and metal members typically used in a piping system. Still other examples include generation of metal particles from the interior of an epitaxial growth apparatus, for example, from a driving unit.

As a method of controlling such contamination originated from an epitaxial growth apparatus, highlighting contamination by increasing the oxygen concentration in a reaction system to detect metal contamination in a highly sensitive manner has been proposed (for example, see JP 2015-029002 A (PTL 1)).

CITATION LIST

Patent Literature

PTL 1: JP 2015-029002 A

SUMMARY

Technical Problem

However, in the technique disclosed in PTL 1, since oxygen gas is introduced at a high concentration, the explosive limits and the detonation limits of hydrogen are low, which has been a problem in handling the introduction of oxygen gas. Further, there seems to be limitations in increasing the sensitivity to the upper limit of the oxygen concentration of 1000 ppm (0.1%) by highlighting the contamination (with Mo, in particular) as disclosed in PTL 1.

It could be helpful to provide a method of controlling contamination of a vapor deposition apparatus, which enables highly sensitive detection of the contamination with metals other than Fe. It could be particularly helpful to provide a method of controlling contamination of a vapor deposition apparatus, which enables highly sensitive detection of the contamination with Ti by highlighting the contamination with Ti. Further, it could also be helpful to provide a method of producing an epitaxial wafer, by which epitaxial growth is performed using a vapor deposition apparatus whose contamination is controlled by the contamination controlling method.

Solution to Problem

This disclosure has been made through intensive studies made by the inventor based on the assumption that the steam pressure of chlorides of contamination metals such as Mo, W, Ti, Nb, and Ta is lower than the steam pressure of Fe chloride (in particular, the steam pressure of Ti chloride is approximately three orders of magnitude lower than that of Fe chloride), and change in the steam pressure of the Fe chloride is greater than change in the steam pressure of the above contamination metals (Ti in particular) at temperatures of around 1000° C. to 1250° C. at the steam pressure.

Specifically, based on the above studies, the inventor found that contamination of a vapor deposition apparatus can be controlled in a highly sensitive manner by measuring and evaluating contamination with a metal element presumed to undergo a significant change in the stem pressure that is highlighted by changing and optimizing the heat treatment temperature and the flow rate of hydrogen flown into the vapor deposition apparatus. This led to this disclosure.

This disclosure primarily includes the following features.

A method of controlling contamination of a vapor deposition apparatus, according to this disclosure includes:

a wafer loading step of loading a wafer for contamination evaluation into a chamber of the vapor deposition apparatus;

a heat treatment step of heat treating the wafer for contamination evaluation at a heat treatment temperature of 1190° C. or more at a hydrogen flow rate of 30 slm or less;

a wafer unloading step of unloading the wafer for contamination evaluation from the inside of the chamber; and a wafer contamination evaluation step of evaluating a level of metal contamination of the wafer for contamination evaluation.

In the method of controlling contamination of a vapor deposition apparatus, according to this disclosure, the heat treatment temperature in the heat treatment step is preferably 1250° C. or less.

In the method of controlling contamination of a vapor deposition apparatus, according to this disclosure, the hydrogen flow rate in the heat treatment step is preferably 10 slm or more and 20 slm or less.

In the method of controlling contamination of a vapor deposition apparatus, according to this disclosure, the level of metal contamination is preferably evaluated with respect to at least one metal selected from the group consisting of Mo, W, Ti, Nb, Ta, Cr, Ni, and Cu.

In the method of controlling contamination of a vapor deposition apparatus, according to this disclosure, the metal with respect to which the level of metal contamination is evaluated is preferably Ti.

In the method of controlling contamination of a vapor deposition apparatus, according to this disclosure, the level of metal contamination with Ti is preferably evaluated after obtaining an evaluation result of a level of metal contamination with Fe of $3 \times 10^7$ atoms/cm$^2$ or less.

In a method of producing an epitaxial wafer, according to this disclosure, epitaxial growth is performed using a vapor deposition apparatus whose contamination is controlled using the method of controlling contamination described above.

In the method of producing an epitaxial wafer, according to this disclosure, epitaxial growth is preferably performed using the vapor deposition apparatus whose contamination is controlled so that Ti in the wafer for contamination evaluation, with respect to which the level of metal contamination is evaluated in the wafer contamination evaluation step is $1\times10^7$ atoms/cm$^2$ or less.

Advantageous Effect

The disclosed method of controlling contamination of a vapor deposition apparatus can detect metal contamination in a highly sensitive manner. In particular, metal contamination with Ti can be detected in a highly sensitive manner by highlighting metal contamination with Ti.

Further, according to the disclosed method of producing an epitaxial wafer, a high quality epitaxial wafer with reduced metal contamination can be obtained.

DETAILED DESCRIPTION

Embodiments of a method of controlling contamination of a vapor deposition apparatus will be demonstrated in detail with reference to the drawings.

Figure 1:
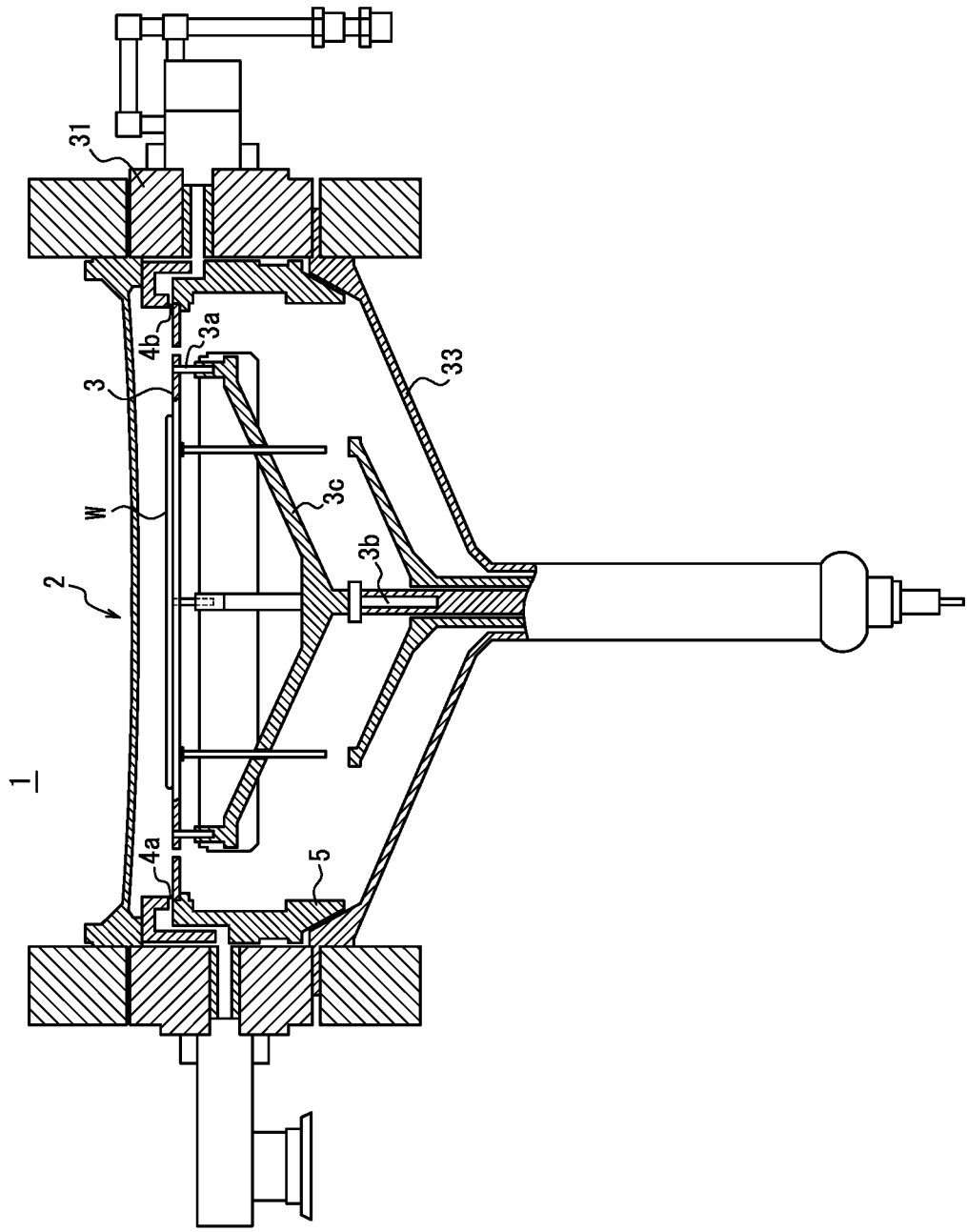
FIG. 1 is a cross-sectional view illustrating an example of a vapor deposition apparatus used in a method of controlling contamination of a vapor deposition apparatus according to one embodiment of this disclosure.

FIG. 1 is a cross-sectional view illustrating an example of a vapor deposition apparatus used in a method of controlling contamination of a vapor deposition apparatus according to one embodiment of this disclosure. Using a vapor deposition apparatus 1 as depicted in FIG. 1, an epitaxial layer is grown on a wafer W (silicon wafer in this example) in the vapor deposition apparatus 1.

In the example illustrated in FIG. 1, this vapor deposition apparatus 1 has a chamber 2, and a susceptor 3 horizontally supporting one wafer W is provided in the chamber 2. In the chamber 2, an annular base ring 31 is vertically sandwiched between an upper dome 32 and a lower dome 33, and the inner closed space serves as a reactor. In order to maintain airtightness, O rings (not shown) are individually sandwiched between the upper dome 32 and the base ring 31 and between the lower dome 33 and the base ring 10.

To grow an epitaxial layer on the wafer W, a reactive gas (source gas and carrier gas) are flown along the upper surface of the wafer W, and the wafer W supported on the susceptor 3 is heated to a high temperature of around 1000° C. to 1200° C. Accordingly, the vapor deposition apparatus 1 includes heat sources (not shown) for heating the reactor above and below the chamber 2. The upper and lower heat sources may use an infrared lamp or a far-infrared lamp, and the heat susceptor 3 and the wafer W are heated from above and below the chamber 2 by radiant heat.

Openings 4a and 4b are formed on the left and right sides of the chamber 2, and the source gas and the carrier gas flow into the upper reactor through one of the openings: a gas inlet 4a, and the gas and the carrier gas after the reaction are discharged through the other opening: a gas outlet 4b. Further, purge gas (for example, hydrogen $H_2$) is supplied from below the chamber 2, and the purge gas filling the lower reactor is discharged from the gas outlet through a purge gas discharge opening provided on a lower liner 5.

For the source gas, hydrochloric acid gases such as chlorosilane-based gases, for example, trichlorosilane $SiHCl_3$ and dichlorosilane $SiH_2Cl_2$ are typically used. These gases are introduced along with hydrogen $H_2$ that is the carrier gas into the upper reactor, and form an epitaxial layer on a wafer surface by the thermal CVD reaction. The susceptor 3 has a disc shape, and its diameter is larger than that of the wafer W. The susceptor 3 is placed so that the disc plane is horizontal, and the upper surface of the susceptor 3 is provided with a circular wafer receiving recess for receiving the wafer W. The susceptor 3 serves as a heat sink that keeps the temperature of the whole wafer W uniform when the wafer is heated. The susceptor 3 performs rotational motion about the vertical axis as the center of rotation in a plane parallel to the surface of the wafer W during the epitaxial layer growth process.

A susceptor support 3a abuts the undersurface of the susceptor 3 to support the susceptor 3 from below. Three support arms 3c (only two of them are depicted in FIG. 1) are provided on the top of a susceptor support shaft 3b in this example, and the lead end of each support arm has a susceptor support 3a. The support arms 3c are radially arranged from the center of the susceptor support shaft 3b to form angles of 120° when viewed from above.

The susceptor 3 is placed on the susceptor support 3a so that the center of the susceptor 3 and the axial center of the susceptor support shaft 3b coincide, and the rotation of the susceptor support shaft 3b allows the susceptor 3 to be stably rotated without being swayed side to side. The susceptor support shaft 3b is rotated by a rotation drive motor (not shown). The susceptor support shaft 3b and the support arms 3c are formed of highly pure transparent quartz so as not to block light from the lower heat source.

Figure 2:
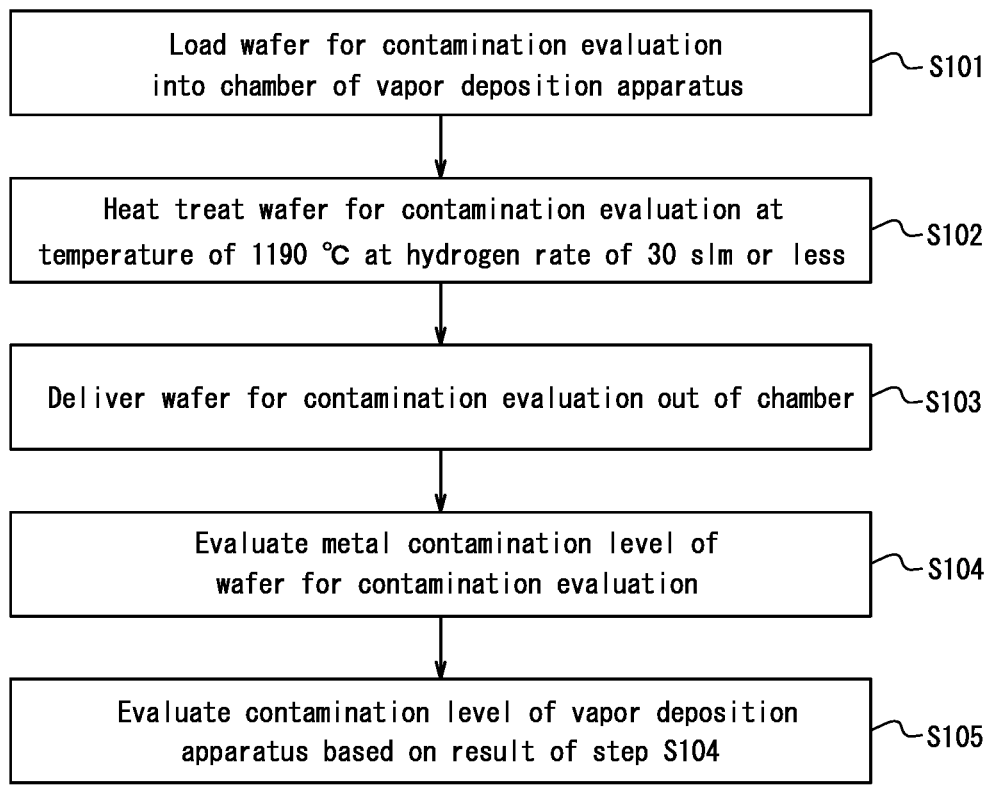
FIG. 2 is a flow diagram of a method of controlling contamination of a vapor deposition apparatus according to one embodiment of this disclosure.

FIG. 2 is a flow diagram illustrating a method of controlling contamination of a vapor deposition apparatus according to one embodiment of this disclosure. In this embodiment, first, hydrogen gas is flown into the chamber 2 of the vapor deposition apparatus 1 having been cleaned (without reaction gases such as hydrochloric acid gas being included) to purge the chamber 2 with a hydrogen gas atmosphere. Subsequently, the wafer W for contamination evaluation is transferred onto the susceptor 3 inside the chamber 2 of the vapor deposition apparatus 1 (wafer loading step)(step S101). In this example, the wafer W for contamination evaluation is a silicon wafer.

Next, as illustrated in FIG. 2, in the gas atmosphere containing the source gas and the hydrogen gas described above, the wafer W for contamination evaluation is heat treated at a heat treatment temperature of 1190° C. or more at a hydrogen flow rate of 30 slm or less (heat treatment step)(step S102). Here, the heat treatment time is preferably 3 min to 15 min, and the heat treatment is preferably performed only once. This prevents contamination metals from diffusing into the wafer W, thus the metal elements can be highlighted on the surface of the wafer W, which allows for highly sensitive analysis.

Subsequently, as illustrated in FIG. 2, the wafer W for contamination evaluation is unloaded from the chamber 2 (wafer unloading step)(step S103). In this example, the wafer W for contamination evaluation having been subjected to the above heat treatment step (step S102) is unloaded from the chamber 2 to a transfer chamber. The wafer W for contamination evaluation whose metal contamination has been highlighted in the heat treatment step (step S102) is unloaded from the chamber 2 by a wafer transfer unit, and delivered outside the vapor deposition apparatus 1 after being cooled in a cooling chamber.

Subsequently, as illustrated in FIG. 2, the level of metal contamination of the wafer W for contamination evaluation delivered outside the chamber 2 in the above wafer unloading step (step S103) is evaluated (wafer contamination evaluation step)(step S104).

The wafer contamination evaluation is preferably performed by metal concentration measurement by chemical analysis and/or lifetime measurement.

<Chemical Analysis>

The metal wafer W for contamination evaluation whose contamination has been highlighted is subjected to chemical analysis, and the metal concentration in the wafer W for contamination evaluation is measured. In the metal concentration measurement by chemical analysis, the concentration of each metal element in the surface layer part can be found. Accordingly, based on the metal concentration measured by chemical analysis, the contamination state inside the chamber 2 of the vapor deposition apparatus 1 can be ascertained in detail for each metal element.

The analytes which can cause contamination may be metals that diffuse slowly, such as Mo, W, Ti, Nb, and Ta. Further, analysis may be performed also with respect to Cr, Ni, and Cu in addition to the above metals diffusing slowly. The chemical analysis is preferably performed by inductively coupled plasma mass spectrometry (IPC-MS). Further, the chemical analysis is also preferably performed by vapor phase decomposition.

The metals such as Mo, W, Ti, Nb, and Ta to be analytes diffuse slowly, so that most of them are assumed to be present on the surface of the wafer W for contamination evaluation and in a surface layer to a depth of approximately 5 μm. Therefore, metal contamination control is enabled by performing the analysis of the surface of the wafer W for contamination evaluation whose metal contamination has been highlighted and the analysis of the surface layer.

<Lifetime>

The lifetime is for example determined by measuring the time of recombination of carriers (holes and electrons) in the wafer W for contamination evaluation whose metal contamination has been highlighted by for example μ-PCD (recombination lifetime). When heavy metal contamination and others are found in the wafer W for contamination evaluation, the recombination lifetime is short; accordingly, whether the wafer W for contamination evaluation is defective or not can easily be determined by measuring the recombination lifetime.

Since it is difficult to identify metal elements using the recombination lifetime, when the amount of contamination of the vapor deposition apparatus is equal to or less than a predetermined value, where the amount of contamination with Fe chiefly forming the vapor deposition apparatus is sufficiently small, the highlighted metals diffusing slowly such as Mo, W, Ti, Nb, and Ta are preferably evaluated using the recombination lifetime.

Note that the amount of contamination with Fe being sufficiently small, that is, the predetermined value or less corresponds to the case of $3 \times 10^7$ atoms/cm$^2$ or less.

In the case of a sufficiently small amount of Fe contamination ($3 \times 10^7$ atoms/cm$^2$ or less), for example, when the lifetime value determined to correspond to non-defective products under evaluation conditions according to this disclosure is set to 600 μs or more, the lifetime value itself seems to be set lower than that in conventional evaluation methods; however, highly pure epitaxial wafers can be produced using a vapor deposition apparatus in which the amount of Fe contamination is $3 \times 10^7$ atoms/cm$^2$ or less and the amount of contamination with Ti is $1 \times 10^7$ atoms/cm$^2$ or less. Accordingly, in performing the above chemical analysis, the amount of contamination with Fe is preferably also analyzed.

Subsequently, as illustrated in FIG. 2, based on the measurement results of the wafer contamination evaluation step (step S104), the contamination level of the vapor deposition apparatus 1 is evaluated (vapor deposition apparatus contamination evaluation step)(step S105). As described above, since the contamination of the vapor deposition apparatus 1 causes wafer contamination, the evaluation results of the contamination level of the vapor deposition apparatus 1 and the contamination level of the wafer are considered to have correlations. Thus, for example, the contamination level of the vapor deposition apparatus 1 can be evaluated based on the measurement results of the metal concentration measurement by chemical analysis and/or the lifetime measurement.

The operation and effect of this embodiment will be described below.

Figure 3:
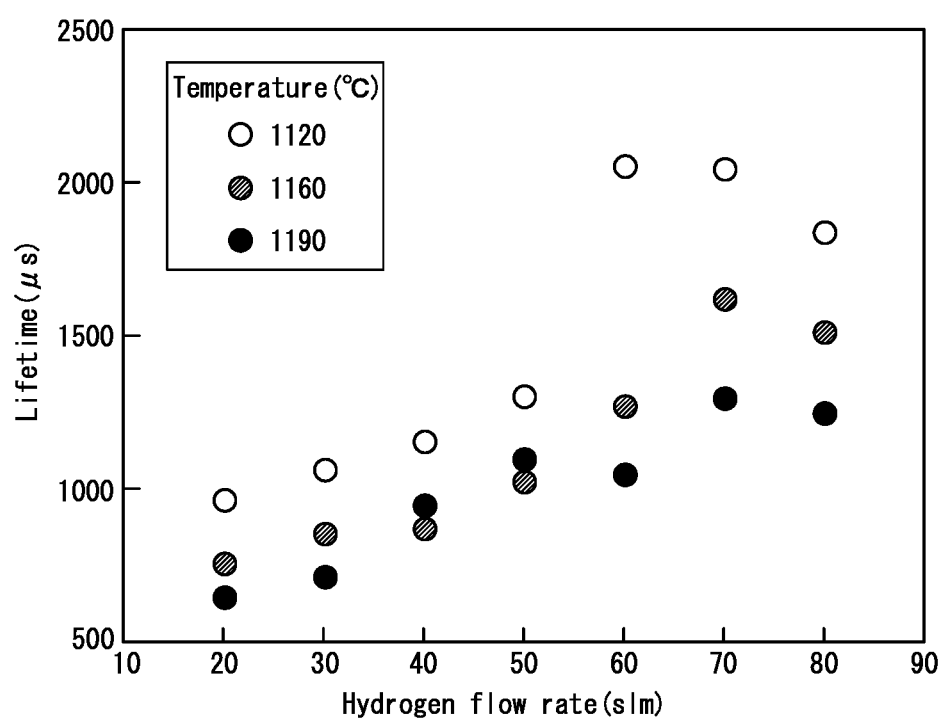
FIG. 3 is a diagram illustrating the relationship between the hydrogen flow rate and the lifetime of an epitaxial wafer on a temperature basis.

FIG. 3 is a diagram illustrating the relationship between the hydrogen flow rate and the lifetime of an epitaxial wafer on a temperature basis. FIG. 3 illustrates the results of performing step S101 to step 103 described above (heat treatment time in the heat treatment step: 10 min) and performing the lifetime measurement (μ-PCD) in step S104.

As illustrated in FIG. 3, when the hydrogen flow rate is 60 slm or more, a higher heat treatment temperature is likely to result in a shorter lifetime. However, when the hydrogen flow rate is reduced from 60 slm, the lifetime tends to decrease at any temperature given in FIG. 3. The inventor of this disclosure found a very strong correlation between the lifetime and the flow rate compared with the correlation between the lifetime and the temperature. More specific investigation demonstrated that the tendency of shortening of the lifetime appeared again as the heat treatment temperature was higher when the hydrogen flow rate was set to a significantly low flow rate of 30 slm or less.

As is evident from FIG. 3, performing heat treatment at a high temperature of 1190° C. at a hydrogen flow rate of 30 slm or less can best highlight contamination, resulting in a short lifetime. Such a tendency was also found even at temperatures exceeding 1190° C. at a hydrogen flow rate of 30 slm or less. The heat treatment temperature in the heat treatment step is preferably 1250° C. or less considering the heat resistance of the chamber 2 and the like. A smaller lifetime value indicates the effect of highlighting contamination.

Further, since the elements of concern are not identified using only the lifetime, the concentration of each heavy metal element was measured.

Figure 4:
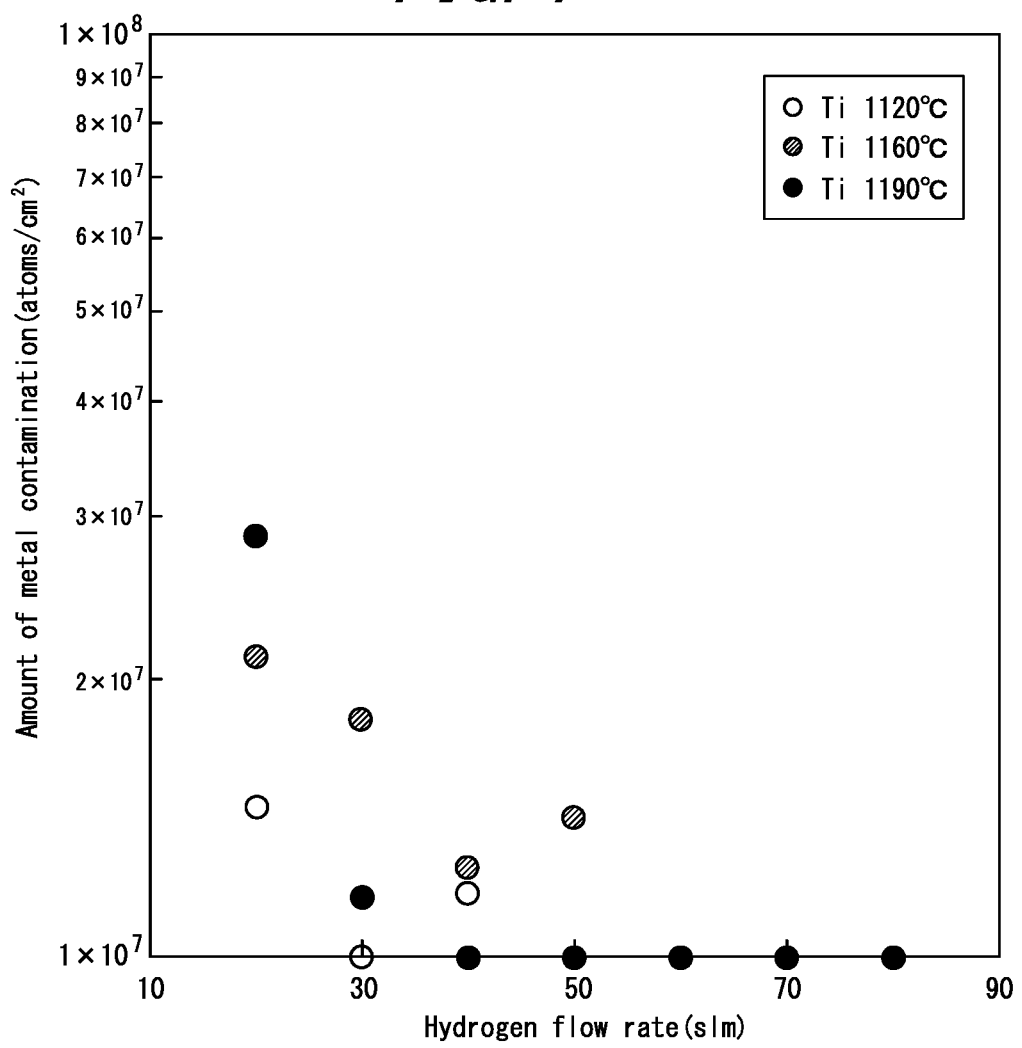
FIG. 4 is a diagram illustrating the relationship between the hydrogen flow rate and the Ti concentration of an epitaxial wafer on a temperature basis.

FIG. 4 is a diagram illustrating the relationship between the hydrogen flow rate and the Ti concentration of an epitaxial wafer on a temperature basis. FIG. 4 illustrates the results of performing step S101 to step 103 described above (heat treatment time in the heat treatment step: 10 min) and performing the Ti concentration measurement by chemical analysis described above (ICP-MS evaluation) in step S104.

As is evident from FIG. 4, when the hydrogen flow rate was 40 slm or more, the amount of Ti detected was smaller than the detection limit at a heat treatment temperature of 1190° C., although the amount of Ti slightly varied depending on the temperature; however, when the hydrogen flow rate was 30 slm or less, more Ti was detected at lower hydrogen flow rates. In particular, when the hydrogen flow rate was 30 slm or less, Ti was detected even at a heat treatment temperature of 1190° C., and further when the hydrogen flow rate was 20 slm or less, the concentration of detected Ti was found to be highest compared with the other heat treatment temperatures. This also applied to hydrogen flow rates of 10 slm or less. One of the factors considered to cause reduction in the lifetime when the hydrogen flow rate is 40 slm or less is increase in the Ti concentration. Other metals are considered to have the same tendency.

Note that such a tendency was also observed at temperatures exceeding 1190° C. when the hydrogen flow rate was 30 slm or less, and this also applied to the other contamination metals.

The above demonstrates that in the above heat treatment step (step S102), contamination is highlighted by performing heat treatment on the wafer W for contamination evaluation at a temperature of 1190° C. or more at a hydrogen flow rate of 30 slm or less, thus metal contamination can be detected in a highly sensitive manner.

The heat treatment temperature in the heat treatment step (step S102) is preferably 1250° C. or less considering the considering the heat resistance of the chamber 2 and the like.

The hydrogen flow rate in the heat treatment step (step S102) is preferably 10 slm or more and 20 slm or less. A hydrogen flow rate of 20 slm or less allows for further highlight of contamination, thereby detecting metal contamination in a highly sensitive manner.

Note that in an epitaxial production system, considering the flow rate of hydrogen flown during epitaxial growth without switching using valves or the like and the hydrogen flow rate based on the disclosed evaluation method, the hydrogen flow rate is preferably 10 slm or more, since the accuracy of the flow rate is poor when the hydrogen flow rate is less than 10 slm.

EXAMPLES

Example 1

To confirm the advantageous effect of this disclosure, after cleaning a vapor deposition apparatus, change in the evaluation results of the amount of Ti detected by ICP-MS and the lifetime determined by μ-PCD were compared between the case of baking temperature: 1190° C. and hydrogen flow rate: 20 slm (Example 1) and the case of baking temperature: 1120° C. and hydrogen flow rate: 70 slm (Comparative Example 1).

Here, a p-type (100) wafer having a diameter of 300 mm and a resistivity of 5 Ω·cm to 40 Ω·cm was used as a wafer for contamination evaluation. First, after parts replacement and parts cleaning of the vapor deposition apparatus; hydrogen bake (bake-out), etching using hydrogen gas to which hydrogen chloride gas was added and dummy runs of epitaxial growth were repeated a plurality of times. After performing the dummy runs corresponding to the production of 250 epitaxial wafers, four wafers for measuring lifetime and ICP were loaded into the vapor deposition apparatus and heat treatment using hydrogen was performed for ten minutes. A first wafer of the wafers was introduced into an epitaxial reactor at a heat treatment temperature of 1120° C. at a hydrogen flow rate of 70 slm, followed by the introduction of a second wafer into the epitaxial reactor at a heat treatment temperature of 1190° C. at a hydrogen flow rate of 20 slm. At the same time, the heat treatment was performed under the conditions where the heat treatment temperature and the flow rate were opposite to those for the first and second wafers. Further, after treating a predetermined number of wafers, wafers for measuring lifetime and ICP-MS were loaded into the vapor deposition apparatus under the above conditions. After that, epitaxial growth for forming an epitaxial layer with a thickness of 4 μm was repeated, and the above wafers for measuring lifetime and ICP-MS were regularly loaded.

Figure 5:
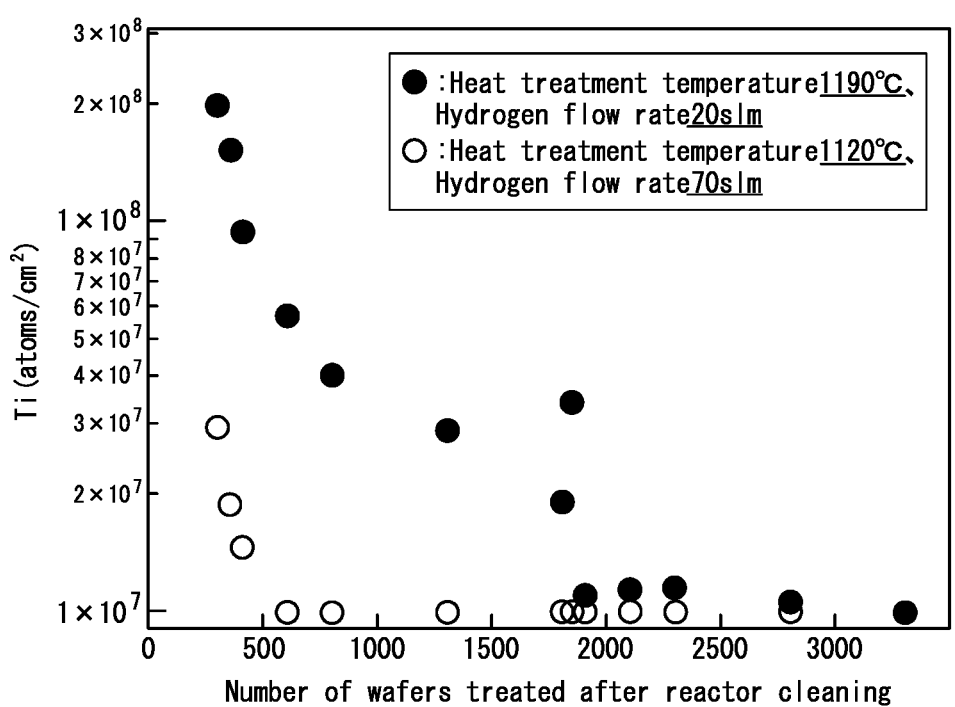
FIG. 5 is a diagram illustrating the relationship between the number of epitaxial wafers to be treated and the Ti concentration thereof after cleaning a vapor deposition apparatus in Examples.
Figure 6:
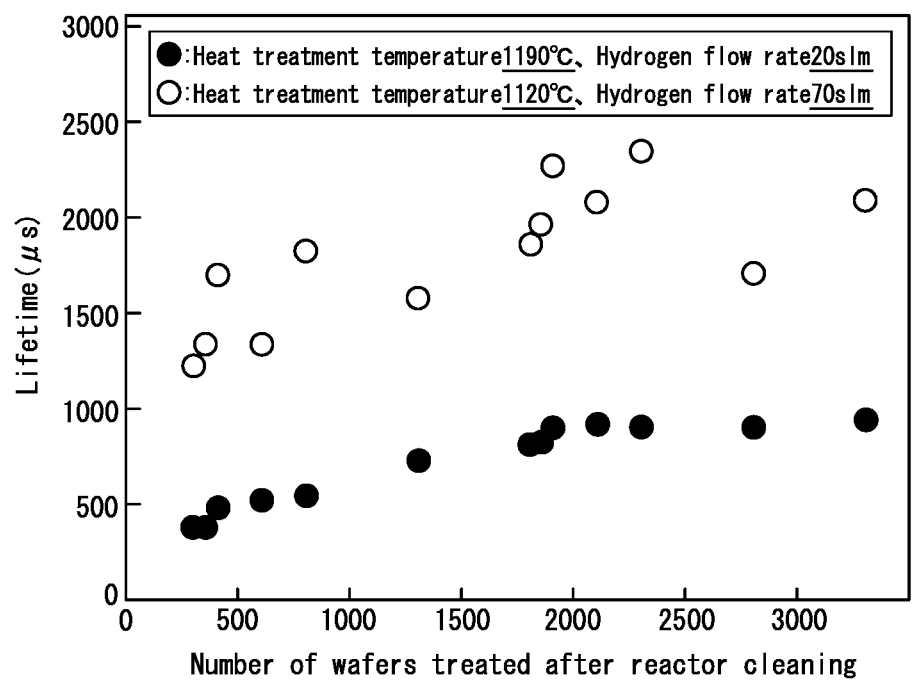
FIG. 6 is a diagram illustrating the relationship between the number of epitaxial wafers to be treated and the lifetime thereof after cleaning a vapor deposition apparatus in Examples.

As illustrated in FIG. 5, in Comparative Example 1, the Ti concentration reached the detection limit in approximately the 600th run, whereas in Example 1, Ti could be detected to an amount equal to or more than the detection limit up to approximately the 3000th run. Further, as illustrated in FIG. 6, the lifetime was lower in Example 1 compared with Comparative Example 1. These results demonstrate that metal contamination was detected in a highly sensitive manner by highlighting the contamination in Example 1.

Example 2

As with Example 1, after cleaning a vapor deposition apparatus, the amount of Ti detected by ICP-MS was evaluated. Based on the result, the limit of Ti for determining the time when the vapor deposition apparatus would be cleaned, or the time when hydrogen bake (bake-out), etching using hydrogen gas to which hydrogen chloride gas was added, and dummy runs of epitaxial growth would be performed was set. Change in the amount of metal contamination of wafers whose contamination was controlled was compared between the case of heat treatment temperature: 1190° C. and hydrogen flow rate: 20 slm (Example 2) and the case of baking temperature: 1120° C. and hydrogen flow rate: 70 slm (Comparative Example 2).

Figure 7:
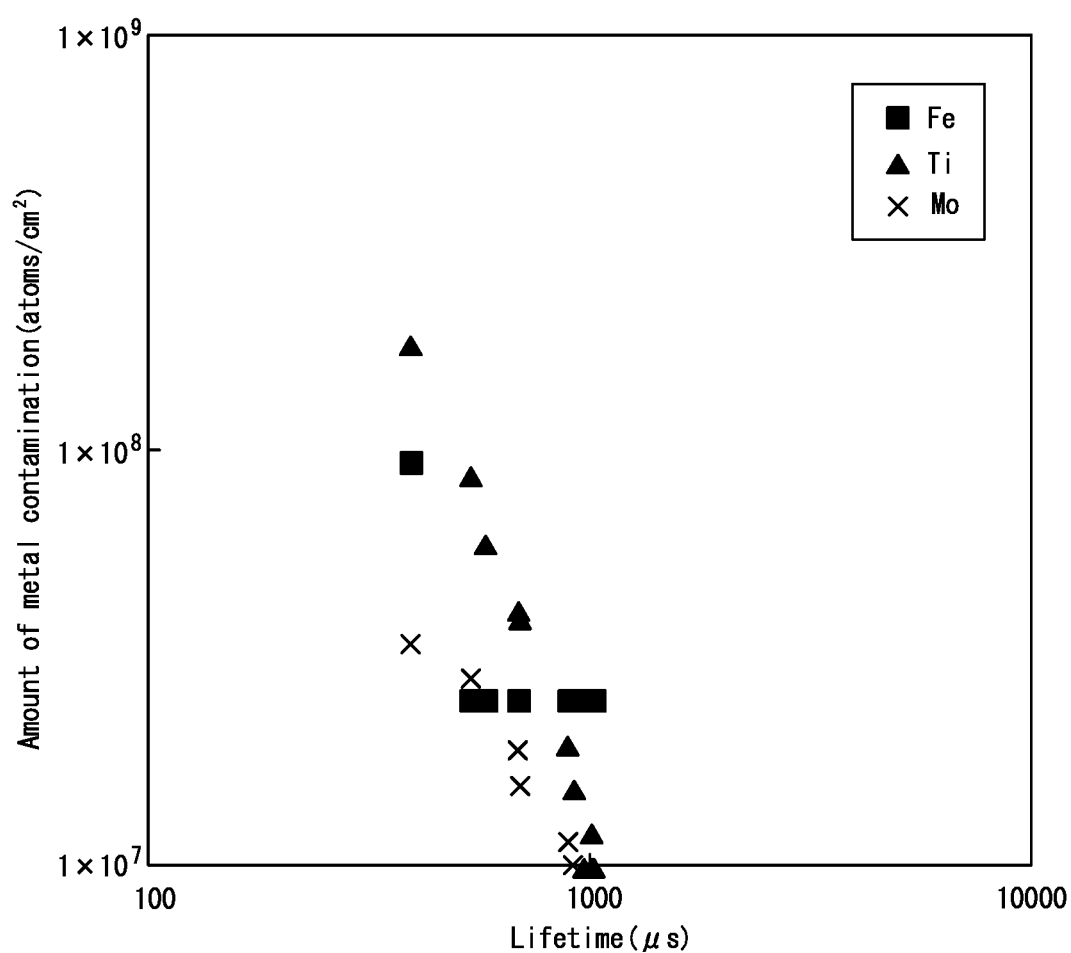
FIG. 7 is a diagram illustrating the relationship between the lifetime and the amount of metal contamination when the contamination control of Example 2 was performed.
Figure 8:
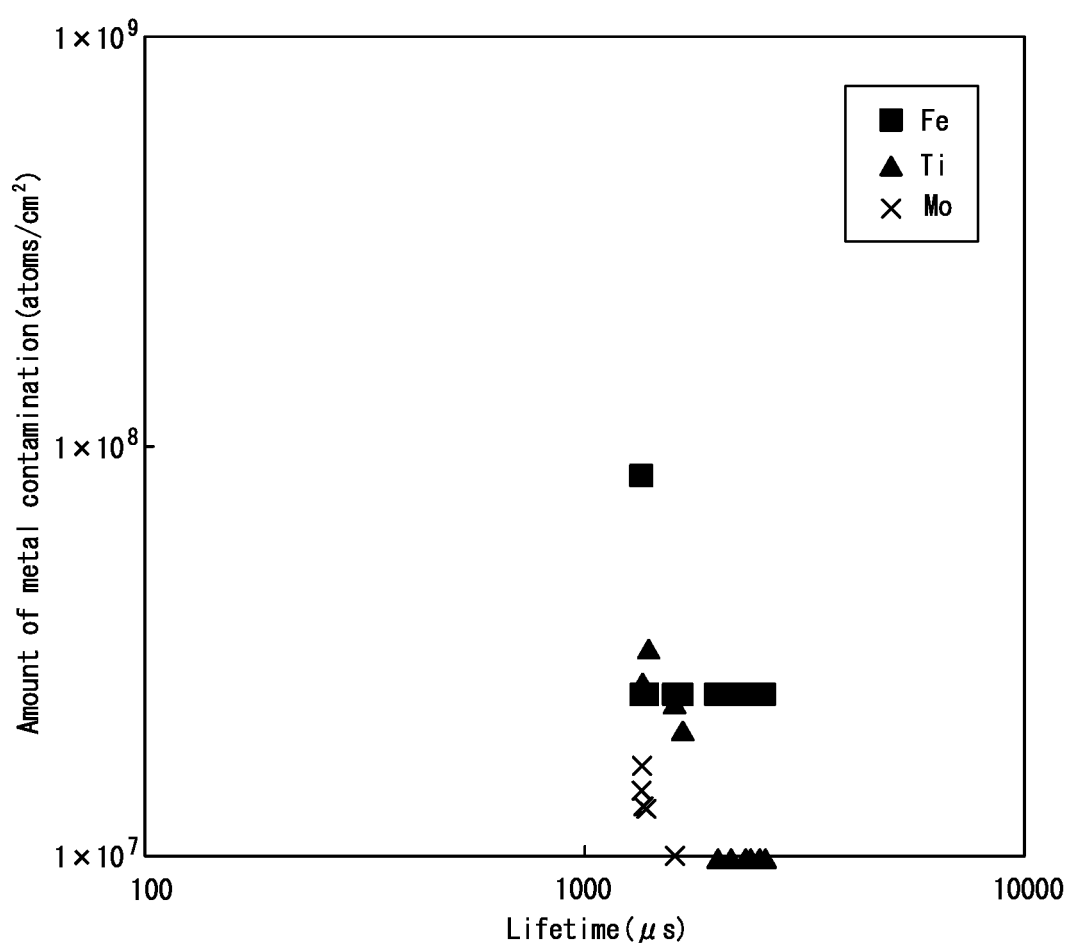
FIG. 8 is a diagram illustrating the relationship between the lifetime and the amount of metal contamination when the contamination control of Comparative Example 2 was performed.

As is evident from FIG. 7, in Example 2, the amount of contamination with Fe remained equal to or less than the detection limit, although the lifetime value increased, whereas the amounts of metal contamination with Mo and Ti decreased as the lifetime value increased, thus contamination control was performed in a highly sensitive manner. As is evident from FIG. 7, the amount of metal contamination with Ti sharply decreased in particular, thus highly sensitive contamination control was performed. On the other hand, As is evident from FIG. 8, metal contamination with all Fe, Mo, and Ti was not sufficiently detected in Comparative Example 2, thus highly sensitive contamination control was not performed.

REFERENCE SIGNS LIST

1: Vapor deposition apparatus
2: Chamber
3: Susceptor
3a: Susceptor support
3b: Susceptor support shaft
3c: Support arm
31: Base ring
32: Upper dome
33: Lower dome
4a: Opening (gas inlet)
4b: Opening (gas outlet)
5: Lower liner
W: Wafer

The invention claimed is:

1. A method of controlling contamination of a vapor deposition apparatus, comprising:
   a wafer loading step of loading a wafer for contamination evaluation into a chamber of the vapor deposition apparatus;
   a heat treatment step of heat treating the wafer for contamination evaluation at a heat treatment temperature of 1190° C. or more at a hydrogen flow rate of 30 slm or less;
   a wafer unloading step of unloading the wafer for contamination evaluation from the inside of the chamber; and
   a wafer contamination evaluation step of evaluating a level of metal contamination of the wafer for contamination evaluation.

2. The method of controlling contamination of a vapor deposition apparatus, according to claim 1, wherein the heat treatment temperature in the heat treatment step is 1250° C. or less.

3. The method of controlling contamination of a vapor deposition apparatus, according to claim 1, wherein the hydrogen flow rate in the heat treatment step is 10 slm or more and 20 slm or less.

4. The method of controlling contamination of a vapor deposition apparatus, according to claim 1, wherein the level of metal contamination is evaluated with respect to at least one metal selected from the group consisting of Mo, W, Ti, Nb, Ta, Cr, Ni, and Cu.

5. The method of controlling contamination of a vapor deposition apparatus, according to claim 4, wherein the metal with respect to which the level of metal contamination is evaluated is Ti.

6. The method of controlling contamination of a vapor deposition apparatus, according to claim 5, wherein the level of metal contamination with Ti is evaluated after obtaining an evaluation result of a level of metal contamination with Fe of $3 \times 10^7$ atoms/cm$^2$ or less.

7. A method of producing an epitaxial wafer, comprising performing epitaxial growth using a vapor deposition apparatus whose contamination is controlled using the method of controlling contamination according to claim 1.

8. The method of producing an epitaxial wafer, according to claim 7, wherein epitaxial growth is performed using the vapor deposition apparatus whose contamination is controlled so that Ti in the wafer for contamination evaluation, with respect to which the level of metal contamination is evaluated in the wafer contamination evaluation step is $1 \times 10^7$ atoms/cm$^2$ or less.

* * * * *